Aug. 18, 1964 P. J. CERAVOLO 3,144,719

JIG FOR LOCATING CABINET LATCH COMPONENTS OR THE LIKE

Filed Feb. 8, 1963

INVENTOR.

PHILIP J. CERAVOLO

BY HIS ATTORNEYS

HARRIS, KIECH, RUSSELL & KERN

United States Patent Office 3,144,719
Patented Aug. 18, 1964

3,144,719
JIG FOR LOCATING CABINET LATCH COMPONENTS OR THE LIKE

Philip J. Ceravolo, 2924 Vaquero Ave., Los Angeles, Calif.

Filed Feb. 8, 1963, Ser. No. 257,820
3 Claims. (Cl. 33—194)

The present invention relates in general to a device or jig for correctly locating the parts of two-component cabinet or cupboard latches, or the like, so that the two parts will engage properly when the cabinet or cupboard door is closed, the primary object of the invention being to provide a jig which quickly, easily and accurately locates the parts of two-component latches of various types without any necessity for resorting to trial and error procedures.

The invention finds particular utility in, and was originally embodied in, a jig for locating latch components one of which is to be mounted on a horizontal surface of a cabinet and the other of which is to be mounted on the inner surface of a hinged door of the cabinet. The horizontal cabinet surface on which one latch component is to be mounted may be any horizontal surface of the cabinet adjacent the inner surface of the door. For example, the horizontal cabinet surface may be either surface, and preferably the lower surface, of an intermediate shelf of the cabinet, or it may be the upper surface of the bottom wall of the cabinet, or the lower surface of a top wall of the cabinet, or the like. The hinged cabinet door, on the inner surface of which the other, mating latch component is to be mounted, may be hinged to the cabinet along one vertical edge of the door so that the door pivots, between open and closed positions, about a vertical axis along such vertical edge thereof. For convenience in disclosing it, the invention will be considered herein in connection with cabinet and latch structures of this general character with no intention of specifically limiting the invention thereto except insofar as may be required by the appended claims.

With the foregoing as background, a general object of the invention is to provide a jig for locating mounting screws for the componnets of a two-component cabinet latch, or the like, which latch components are to be mounted on a surface of a cabinet and on a surface of a door of the cabinet, respectively, comprising: a jig body seatable against the cabinet surface; means for maintaining the jig body seated against the cabinet surface in a predetermined location thereon; means carried by the jig body for locating on the cabinet surface the proper location for a screw for attaching to the cabinet surface the latch component which is to be mounted thereon; and means carried by the jig body for locating on the door surface, when the door is closed, the proper location for a screw for attaching to the door surface the latch component which is to be mounted thereon. As previously discussed, the cabinet surface on which one latch component is to be mounted is preferably a horizontal surface, such as one surface, preferably the lower surface, of an intermediate shelf, the upper surface of the bottom wall of the cabinet, or the like. The door surface, on which the mating latch component is to be mounted, is preferably the inner surface of a door hinged for pivotal movement between open and closed positions about a vertical pivot axis extending along one vertical edge of the door.

An object of the invention is to provide a jig wherein the screw locating means associated with the cabinet surface comprises one or more holes through the jig body through which one or more marking devices may be inserted to mark one or more screw locations on the cabinet surface on which one latch component is to be mounted, the number and pattern of screw locating holes depending on the number and pattern of screw holes in the corresponding latch component. Various marking devices, such as punches, awls, or the like, may be used. One marking device may be inserted through all of the screw locating holes, if there be more than one for the particular latch component, in sequence, or marking devices may be inserted through all of the screw locating holes simultaneously, if there be more than one of such holes for a particular latch component.

Another object is to provide a jig wherein the screw locating means associated with the door surface comprises a marking device or devices, engageable with the door surface when the door is closed, for marking the proper screw location or locations for the corresponding latch component, the number of such marking devices corresponding to the number of screw holes in the corresponding latch component. A related object is to provide a marking device for the door surface which is threadedly mounted on the jig body so that its position can be adjusted, relative to the closed position of the door, to achieve the desired depth of penetration into the door surface when the door is closed.

An important object in connection with one embodiment of the invention is to provide a jig having clamping means engageable with the front edge of an intermediate cabinet shelf for maintaining the jig body seated in a predetermined location on one horizontal surface of such shelf, preferably the lower surface thereof. A related object is to provide a jig which, in effect, is a C-clamp adapted to fit over the front edge of such an intermediate shelf and having an arm which forms the aforementioned jig body and which is seatable in a predetermined location on the lower surface of the shelf, the C-clamp having clamping means engageable with the upper shelf surface.

An important object in connection with another embodiment of the invention, for use on a cabinet surface other than an intermediate shelf surface, is to utilize the means for marking the desired screw location or locations on such cabinet surface as the means for maintaining the jig body seated against such cabinet surface in the desired, predetermined location thereon. Thus, in this embodiment, one means serves two functions, viz., a holding function and a marking function.

In utilizing the jig of the invention, it is merely necessary to place the jig body in the desired, predetermined location on the desired cabinet surface, and to activate the holding means for the jig body, such holding means being a clamping means in the case of one embodiment and being the marking means for the screw locations on the cabinet surface in the other embodiment. In connection with the first-mentioned embodiment, it is then necessary to activate the marking means to mark the necessary screw location or locations on the cabinet surface. Then, the door is closed so that the marking device or devices associated with the door surface mark the necessary screw location or locations thereon, it being understood that with the hinged door primarily being considered herein, the marking device or devices associated with the door surface project forwardly from the jig body so that they are automatically engaged by the inner surface of the door, when the door is closed, to mark the screw location or locations thereon.

Thus, it will be apparent that it is merely necessary to mount the jig body on the cabinet surface to be marked, mark the necessary screw location or locations on such cabinet surface in the case of one embodiment, this being done automatically in the case of the other, and, finally, to close the door. This simple sequence of operations, which can be performed quickly and easily, results in marking of the screw location or locations for each component of a two-component latch very accurately, so that the screws for mounting the latch components may be driven in the respective market locations without any necessity for resorting to trial and error procedures, which is an important feature of the invention.

The foregoing objects, advantages, features and results of the present invention, together with various other objects, advantages, features and results thereof which will be evident to those skilled in the art to which the invention relates in the light of this disclosure, may be achieved with the exemplary embodiments of the invention described in detail hereinafter and illustrated in the accompanying drawing, in which.

Figures 1, 2, 3, 4:
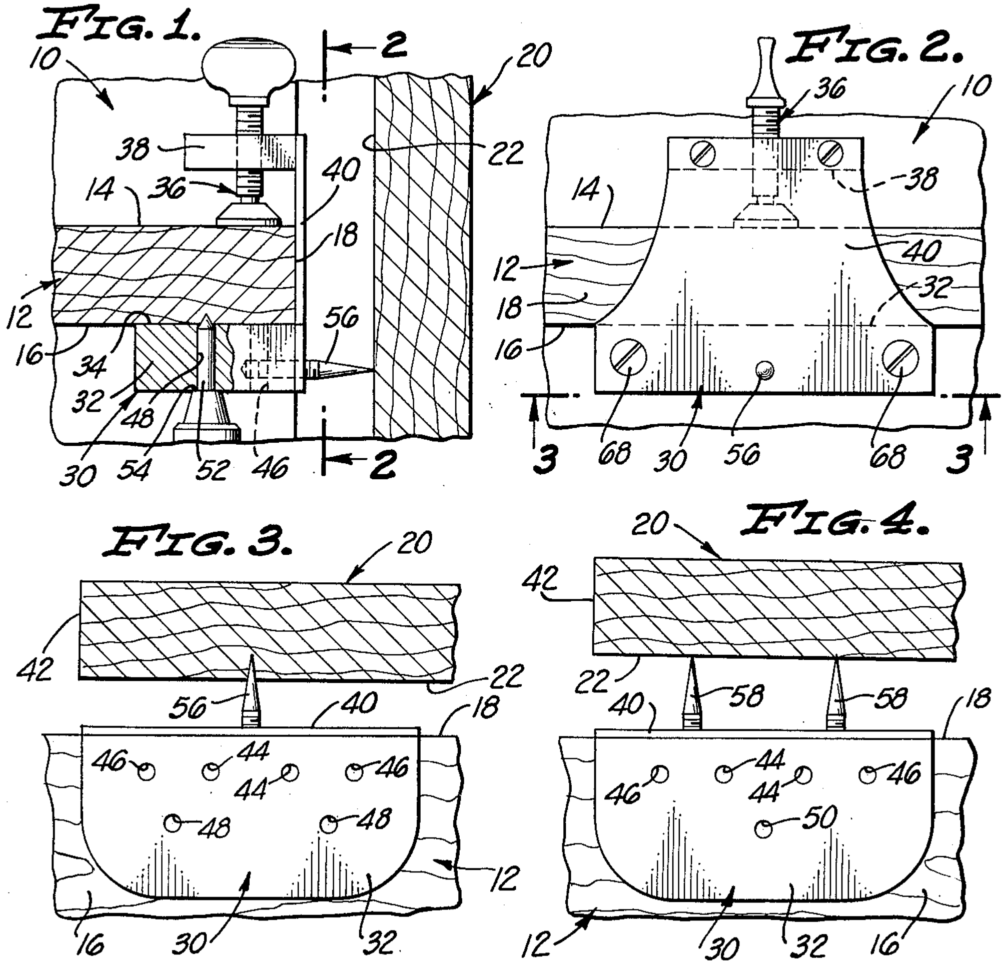
FIG. 1 is a fragmentary vertical sectional view showing the jig of the invention in place on an intermediate shelf of a cabinet to mark screw locations on the lower surface of such shelf and on the inner surface of a cabinet door hinged along one vertical edge thereof.
FIG. 2 is a fragmentary front elevational view taken as indicated by the arrowed line 2—2 of FIG. 1.
FIG. 3 is a fragmentary bottom plan view, partially in section, taken as indicated by the arrowed line 3—3 of FIG. 2.
FIG. 4 is a view similar to FIG. 3, but illustrating an alternative embodiment.

Referring initially to FIGS. 1 to 3 of the drawing, illustrated therein is a fragment of a cabinet or cupboard 10 which includes an intermediate shelf 12 having upper and lower surfaces 14 and 16 and a front edge 18, and which is provided with a door 20 hinged for pivotal movement about a vertical axis extending along one vertical edge of the door in a well known manner, not shown.

The jig of the invention for locating latch-component screw holes on the lower shelf surface 16 and on the inner surface 22 of the door 20, is designated generally by the numeral 30. The jig 30 includes a jig body 32 having a surface 34 seatable against the lower shelf surface 16 in the area where the latch component, not shown, to be mounted on such shelf surface is to be located. In the embodiment under consideration, the jig body 32 is maintained seated against the lower shelf surface 16 by a clamping means 36. In effect, the jig 30 has the form of a C-clamp having one arm which forms the jig body 32 and having another arm 38 which carries the clamping means 36, the latter being of the type conventionally associated with C-clamps. The jig body 32 and the arm 38 are interconnected by a plate 40 which is seatable against the front edge 18 of the intermediate shelf 12 to locate the jig body 32 in the fore-and-aft direction. It will be understood that the jig body 32 is clamped in place, in the lateral direction along the front edge 18 of the shelf 12, a suitable distance from the free vertical edge 42 of the door 20, as suggested in FIG. 3 of the drawing. When the door 20 is closed, its free vertical edge 42 may abut a vertical edge of the cabinet 10 in the case of a flush single door, or it may include a lip overlying the front of the cabinet 10 in the case of a single lip-type door, or it may abut the free vertical edge of another door in the event of a double door cabinet, or the like.

The jig body 32 is provided therethrough with screw locating holes arranged in any desired pattern to match the screw holes in a variety of latch components to be mounted on the lower shelf surface 16. In the particular construction illustrated, the screw-locating-hole pattern includes two holes 44 for one type of latch component, two holes 46 for another type, and two holes 48 for a third. It will be understood, however, that additional holes may be added, or substituted, to cover other latch-component screw-hole patterns. It will also be understood that the jig body 32 may be provided with screw-locating-hole patterns for one-hole latch components, for three-hole latch components, and the like, in addition to the disclosed patterns for two-hole latch components. For example, in FIGS. 4 and 6, the holes 48 are shown as replaced by a single hole 50 for use with a one-screw latch component. Thus, it will be understood that the screw-locating hole pattern in the jig body 32 is dependent solely on the screw-hole patterns of the latch components with which it is to be used.

For convenience, it will be assumed that the jig 30 is to be used with a latch component to be attached to the lower shelf surface 16 by two screws in locations corresponding to the locations of the locating holes 48. Thus, in order to mark the proper screw locations once the jig 30 has been clamped in the proper position, it is merely necessary to insert a marking device 52, FIG. 1, through the holes 48 and into engagement with the lower shelf surface 16. (It will be understood that the same marking device 52 may be inserted through the two holes 48 in sequence, or that two similar marking devices may be inserted therethrough simultaneously.) Preferably, the marking device 52 takes the form of a punch or awl having a point capable of penetrating the lower shelf surface 16 to provide a hole which not only marks the screw location, but also serves to facilitate starting of a screw when the desired latch component is subsequently mounted. The marking device 52 may have an annular shoulder 54 which limits insertion into the lower shelf surface 16.

In order to mark on the inner surface 22 of the door 20 the corresponding location or locations for the screw or screws for mounting the mating latch component on the door, the jig body 32 is provided with a marking device or devices corresponding in number and position. In the embodiment of FIGS. 1 to 3 of the drawing, there is one marking device 56, whereas, in FIG. 4, two similar marking devices 58 are shown.

Considering the marking device 56, it preferably comprises a punch or awl, or the like, threaded into the front surface of the jig body 32 so that it projects forwardly to engage the inner door surface 22, when the door 20 is closed, and so that the distance which it projects forwardly can be adjusted to secure the desired depth of penetration into the door. The marking devices 58 are similar to the marking device 56, and are similarly threaded into the jig body 32 for adjustment purposes to obtain the desired penetration depths. Again, the marking devices 56 and 58, in addition to marking the corresponding screw locations for the latch components to be mounted, also provide holes which facilitate starting the corresponding screws. It will be understood that the marking devices 56 and 58 may be screwed inwardly or outwardly as required to attain the desired penetration depths despite variations in the distance between the inner door surface 22 and the front shelf edge 18 from one cabinet to another.

Considering the operation of the embodiment of FIGS. 1 to 3 of the drawing, it will be apparent that all that is necessary is to clamp the jig 30 in the proper position on the shelf 12, mark the proper screw locations on the lower shelf surface 16 through the corresponding screw-locating holes in the jig body 32, and close the door 20 to cause the marking device 56 to mark the proper screw location in the inner door surface 22. The necessary screw locations are thus marked quickly and easily, and very accurately so that when the two latch components are subsequently installed, utilizing screws at the marked locations through corresponding screw holes in the latch components, the two latch components are correctly positioned relative to each other with great accuracy and with no necessity for resorting to trial and error, which is an important feature of the invention.

The embodiment of FIG. 4 of the drawing is operated in a similar manner, so that a further description is not necessary.

The C-clamp type of jig 30 hereinbefore described probably represents the most convenient form of the invention since it is quickly and easily mounted on any intermediate shelf, such as the shelf 12. An occasional cabinet, however, will not have an intermediate shelf, in which event it is conventional to mount the latch component which goes on the cabinet on the upper surface of the bottom wall of the cabinet. Also, it is sometimes desireable to mount the latch component which goes on the cabinet on the upper surface of the bottom wall even if the cabinet does have one or more intermediate shelves.

Figure 5:
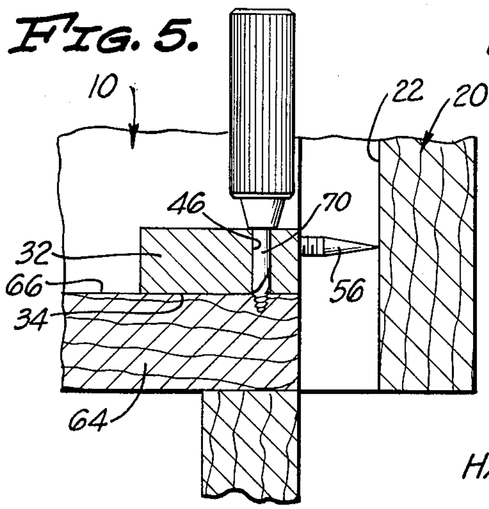
FIG. 5 is a view similar to FIG. 1, but illustrating the jig of the invention in use to mark screw locations on the upper surface of the bottom wall of the cabinet and on the inner surface of the door.
Figure 6:
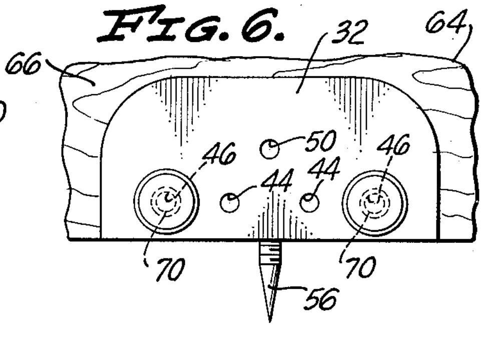
FIG. 6 is a top plan view of the jig of the invention as it is shown in FIG. 5 of the drawing.

Turning now to FIGS. 5 and 6 of the drawing, the cabinet 10 is therein illustrated as having a bottom wall 64 providing an upper surface 66 on which the cabnet latch component is to be mounted, the door latch component being intended to be mounted on the inner surface 22 of the door 20 in the same way as described previously. In this instance, it will be apparent that the jig body 32 cannot be clamped on the bottom wall 64 in the manner hereinbefore described in connection with the intermediate shelf 12. In this case, only the jig body 32 is used, the clamping means 36, the arm 38 and the plate 40 being detached from the jig body, as by removing attaching screws 68. The jig body 32 is now used alone.

First, the jig body 32 is placed in the desired position on the upper surface 66 of the bottom wall 64. The jig body 32 may be located in the fore-and-aft direction by placing the front edge thereof flush with the front edge of the bottom wall 64. Then, the jig body 32 is held in place in the correct position, and the screw locations for the corresponding latch component are simultaneously marked, by inserting marking devices 70, shown as two in number, through the corresponding holes in the jig body. To insure holding the jig body 32 in the correct position against the force required to cause the marking device 56 to mark the corresponding screw location in the inner door surface 22 when the door is closed, one or both of the marking devices 70 may be threaded punches or awls threadable into the bottom wall 64 of the cabinet 10 short distances. In installing the marking and holding devices 70, they may merely be pressed into the bottom wall 64 of the cabinet 10 and then rotated a turn or two, it being understood that this will normally be sufficient to hold the jig body 32 in place, unless the wood, or other material of which the door 20 is formed is exceptionally hard. In that event, marking devices 70 capable of penetrating farther into the bottom wall 64 of the cabinet 10 may be used.

It will be understood that the operation of the jig of the invention, when utilized on the bottom wall 64, is similar to its operation when it is utilized on the intermediate shelf 12, the principal difference being that the holding and marking operations are combined into a single operation. In other words, one means serves as both a holding means and a marking means.

Although exemplary embodiments of the invention have been disclosed herein for purposes of illustration, it will be understood that various changes, modifications and substitutions may be incorporated in such embodiments without departing from the spirit of the invention as defined by the claims which follow:

I claim:

1. In a jig for locating mounting screws for the components of a two-component cabinet latch, or the like, which latch components are to be mounted on a surface of a cabinet and on the inner surface of a hinged door of the cabinet, respectively, the combination of:

(*a*) a jig body having a surface seatable against said cabinet surface;

(*b*) means on said jig body for locating it in a predetermined position relative to one edge of said cabinet surface;

(*c*) first locating means for locating on said cabinet surface the proper position for a screw for attaching to said cabinet surface the latch component which is to be mounted thereon;

(*d*) said first locating means being oriented in a direction perpendicular to said jig-body surface and extending through said jig-body surface;

(*e*) second locating means carried by said jig body, and engageable by said door surface when said door is closed, for marking on said door surface the proper location for a screw for attaching to said door surface the latch component which is to be mounted thereon; and (*f*) said second locating means being oriented in a direction parallel to and being spaced from said jig-body surface.

2. In a jig for locating mounting screws for the components of a two-component cabinet latch, or the like, which latch components are to be mounted on a surface of a cabinet and on the inner surface of a hinged door of the cabinet, respectively, the combination of:

(*a*) a jig body having a surface seatable against said cabinet surface;

(*b*) means on said jig body for locating it in a predetermined position relative to one edge of said cabinet surface;

(*c*) first locating means for locating on said cabinet surface the proper position for a screw for attaching to said cabinet surface the latch component which is to be mounted thereon;

(*d*) said first locating means comprising a locating hole through said jig body which is oriented in a direction perpendicular to and extends through said jig-body surface;

(*e*) second locating means carried by said jig body, and engageable by said door surface when said door is closed, for marking on said door surface the proper location for a screw for attaching to said door surface the latch component which is to be mounted thereon; and (*f*) said second locating means being oriented in a direction parallel to and being spaced from said jig-body surface.

3. A jig as set forth in claim 2 wherein said jig body forms one arm of a C-clamp having another arm spaced from and facing said jig-body surface, said other arm carrying a clamping screw.

References Cited in the file of this patent

UNITED STATES PATENTS

| | | |
|---|---|---|
| 1,540,991 | Holmgren | June 9, 1925 |
| 1,632,824 | Davidson | June 21, 1927 |
| 1,906,611 | Johnson | May 2, 1933 |
| 2,805,484 | D'Aoust | Sept. 10, 1957 |
| 3,078,585 | Dearborn | Feb. 26, 1963 |

FOREIGN PATENTS

| | | |
|---|---|---|
| 27,892 | Finland | Jan. 14, 1956 |